United States Patent
Liang et al.

[11] Patent Number: 6,121,085
[45] Date of Patent: Sep. 19, 2000

[54] METHOD OF FABRICATING CONTACT OPENINGS FOR DYNAMIC RANDOM-ACCESS MEMORY

[75] Inventors: Chia-Wen Liang, Hsinchu Hsien; Sun-Chieh Chien; Der-Yuan Wu, both of Hsinchu; Jason Jenq, Pingtung, all of Taiwan

[73] Assignee: United Microelectronics Corp., Hsin-Chu, Taiwan

[21] Appl. No.: 09/009,508

[22] Filed: Jan. 20, 1998

[30] Foreign Application Priority Data

Dec. 1, 1997 [TW] Taiwan .................................. 86118030

[51] Int. Cl.[7] .......................... H01L 21/8242; H01L 21/20
[52] U.S. Cl. ........................... 438/256; 438/253; 438/396; 438/399
[58] Field of Search ..................... 438/256, 399, 438/253, 396

[56] References Cited

U.S. PATENT DOCUMENTS

| | | | |
|---|---|---|---|
| 5,550,076 | 8/1996 | Chen | 437/52 |
| 5,554,557 | 9/1996 | Koh | 437/52 |
| 5,646,061 | 7/1997 | Wang et al. | 437/52 |
| 5,672,534 | 9/1997 | Huang | 437/52 |
| 5,688,713 | 11/1997 | Linliu et al. | 437/60 |
| 5,869,861 | 2/1999 | Chen | 257/308 |

FOREIGN PATENT DOCUMENTS 293930  12/1996  Taiwan .

OTHER PUBLICATIONS

S. Wolf and R.N. Tauber, Silicon Processing for the VLSI Era, vol. 1, Lattice Press, p. 169, 1986.

*Primary Examiner*—Donald L. Monin, Jr.
*Assistant Examiner*—S. Rao
*Attorney, Agent, or Firm*—Rabin & Champagne, P.C.

[57] ABSTRACT

A method of making contact openings for memory cell units of DRAM IC devices is disclosed. The contact opening is used to connect the cell transistor source/drain terminal to the storage capacitor electrode located substantially above. The method includes the step of first patterning the initial opening in a shielding layer for the contact opening. The diameter of the initial opening is then reduced by the formation of sidewall spacers in initial opening. The initial opening in the shielding layer is then used to implement the etching for the formation of the contact opening. Due to reduced size of the contact opening, short-circuiting situations arising between the via formed in the contact opening and the bit lines next to the via as a result of misalignment in the process of fabrication can be reduced, thereby improving the device fabrication yield rates.

13 Claims, 4 Drawing Sheets

METHOD OF FABRICATING CONTACT OPENINGS FOR DYNAMIC RANDOM-ACCESS MEMORY

CROSS-REFERENCE TO RELATED APPLICATION

This application claims the priority benefit of Taiwan application serial no. 86118030, filed Dec. 1, 1997, the full disclosure of which is incorporated herein by reference.

BACKGROUND OF THE INVENTION

1. Field of the Invention

This invention relates in general to a method of fabricating semiconductor integrated circuit (IC) devices and, in particular, to a method of fabricating dynamic random-access memory (DRAM) devices. More particularly, this invention relates to a method of fabricating contact openings for DRAM devices.

2. Description of Related Art

Semiconductor DRAM devices are widely used in various digital electronic equipment, and is virtually indispensable in many state-of-the-art digital computing electronics in information industry. FIG. 1 of the accompanying drawings is a schematic diagram showing a memory cell unit of a typical DRAM device. As is illustrated, a transfer transistor T and a storage capacitor C constitute a basic memory cell unit for a DRAM. The source terminal of the transfer transistor T is connected to a corresponding bit line BL for the memory cell unit in the array, while the drain thereof is connected to one electrode 6 of the storage capacitor C. The gate electrode of the transfer transistor T is strobed by a word line WL of the memory array. Electrode 8 of the storage capacitor C opposite to electrode 6 is connected to a fixed electric potential of the DRAM system. Sandwiched between the electrodes 6 and 8 of the storage capacitor C is a layer of dielectric material 7.

As is well known in the art, the storage capacitor C is used to store the data bit in the memory cell unit by of its charged or discharged status, and the capacitor should be able to hold a sufficient amount of electric charge. Inherent structural characteristics of DRAM memory cell units inevitably lead to leakage of charge stored in the storage capacitor. Without a sufficiently large capacitance, the memory cell unit can not sustain an electrical charge above a threshold level during normal cell unit refresh cycles, and data loss results.

FIGS. 2A–2B of the drawings are cross-sectional views of a DRAM memory cell unit as it would appear at various; stages of a conventional process of making contact openings for the cell unit. In the capacitor-over-bit line structural configuration for DRAM devices, the contact opening is used to install a via that is used to electrically connect the bottom electrode (6 in FIG. 1) of the storage capacitor (C) to the source/drain region of the transfer transistor (T). With reference to FIG. 2A, a memory cell transistor, together with an oxide layer 14 for its electrical insulation, bit lines 16, and a second oxide layer 18 for insulating the bit line 16, is formed on the substrate 10 of the semiconductor device being fabricated. The transistor includes a gate electrode 12, sidewall spacer 13 for the gate electrode 12, and a pair of source/drain regions 15. The first oxide layer 14 and the second oxide layer 18 can be formed of silicon oxide, and the bit line 16 may be formed of doped polysilicon. The second oxide layer 18 not only covers the surface of the bit lines 16, but further, fills into the spacing between consecutive bit lines 16. The spacing between bit lines 16 is substantially located above the corresponding source/drain region 15 of the cell unit transistor. In other words, the bit lines 16 themselves are virtually misaligned vertically with the transistor source/drain region 15.

Referring to FIG. 2A, a polysilicon or silicon nitride layer 20 is formed covering the surface of the second oxide layer 18 in, for example, a low-pressure chemical vapor deposition (LPCVD) procedure. If polysilicon is used for deposition, it can be further doped with impurities.

Then, as illustrated in FIG. 2B, a photolithographic procedure is employed to form a contact opening in the structure. This location is virtually above the transistor source/drain region 15 as shown in the drawing. This includes forming a photoresist layer that exposes the location of the contact opening, and subsequently etching anisotropically into the doped polysilicon or silicon nitride layer 20, the second oxide layer 18, and the first oxide layer 14. The anisotropic etching concludes when the transistor source/drain region 15 is exposed and the contact opening 22 is now formed.

In this conventional fabrication procedure, however, bit lines 16 may be exposed laterally in the sidewall of the contact opening 22 if the alignment of the photolithographic procedure was not controlled properly. If this was the case, the electrically conductive via formed in the contact openings 22 may be short-circuited with the bit lines 16. The yield deteriorates as a result of such short-circuiting.

Further, in the fabrication procedure for making the capacitor-over-bit line structural configuration for DRAM devices, the spaces left between the contact opening and the transistor gate electrode and between the contact opening and the polysilicon layer used as the word line become uncomfortably narrow. This requires a reduction of the size of the contact opening. In other words, the contact openings are required to have a smaller diameter. However, under a 0.35 μm design rule, the photolithographic procedure itself, or the etching cross-sectional profile control employed to effect the reduction of contact opening sizes become difficult to implement. This is because deep ultraviolet light must be used. Deep ultraviolet photolithography has poor control capability over etching profiles. Further, deep ultraviolet light is virtually no more suitable for fabrication procedures employing a resolution finer than 0.35 μm.

SUMMARY OF THE INVENTION

It is therefore an object of the invention to provide a method of fabricating contact opening for DRAM devices for making reduced-size contact openings, that avoids short-circuiting between the via to be formed inside the contact opening and the bit lines located nearby, thereby improving the device yields.

The invention achieves the above-identified object by providing a method of fabricating a contact opening for memory cell units of a semiconductor DRAM IC device that includes the steps of first forming a cell unit transistor, a first oxide layer insulating the transistor, a bit line and a second oxide layer for insulating the bit line on the substrate of the IC device. A polysilicon shielding layer is then formed covering the second oxide layer. The shielding layer is then patterned in a photolithographic procedure to form an initial opening for defining the contact opening located substantially above the source/drain region of the transistor to be electrically connected and for revealing the surface of the second oxide layer in the region of the defined contact opening. A sidewall spacer is then formed to cover the sidewall of the initial opening. An anisotropic etching procedure then follows to subsequently etch into the second oxide layer and the first oxide layer exposed in the initial opening, thereby revealing the surface of the source/drain region of the cell unit transistor.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
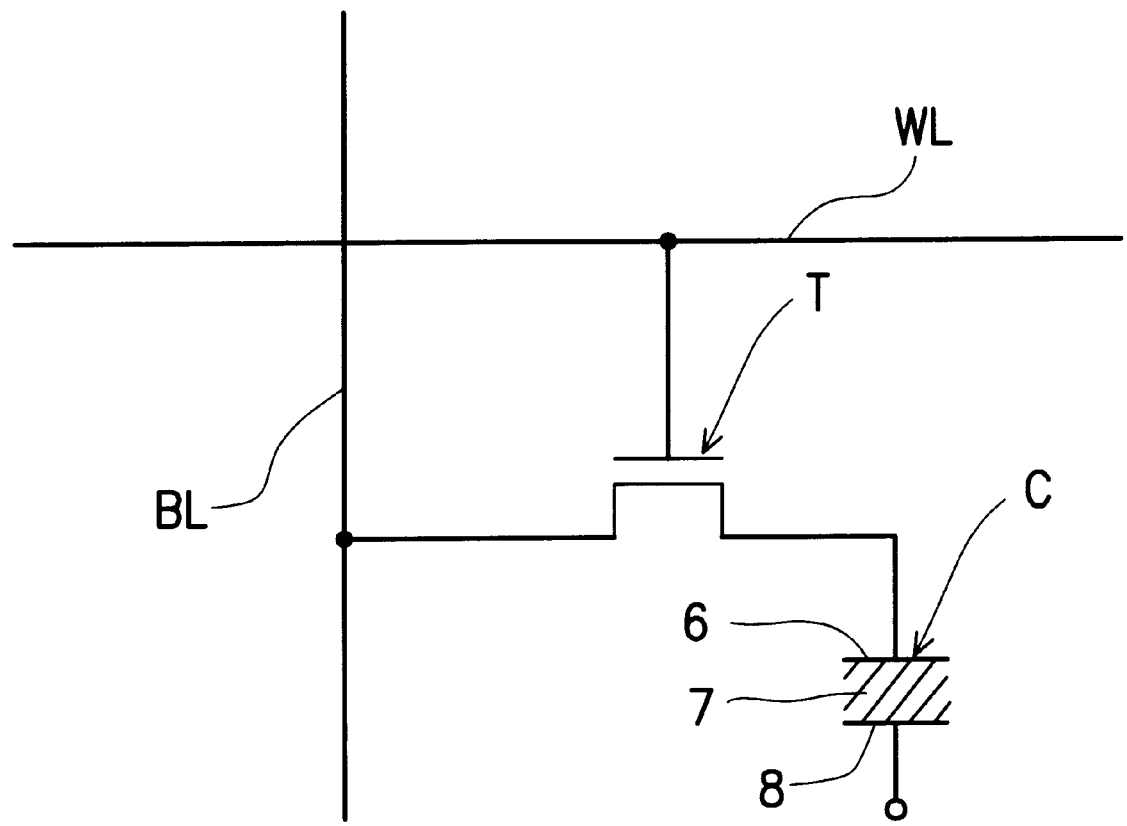
FIG. 1 is a schematic diagram showing the circuitry of a memory cell unit of a typical DRAM device.
Figure 2A:
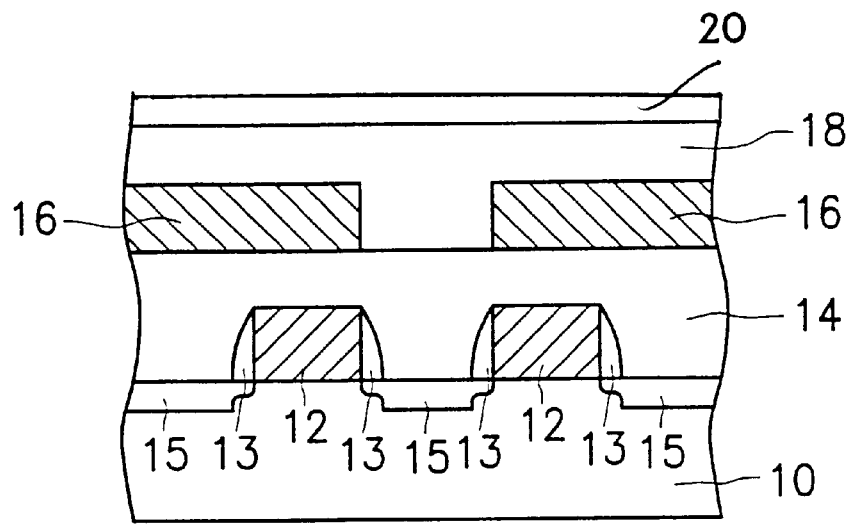
FIGS. 2A–2B respectively show the cross-sectional views of a DRAM memory cell unit depicted from the process stages of a conventional fabrication method for making contact openings for the cell unit.
Figure 2B:
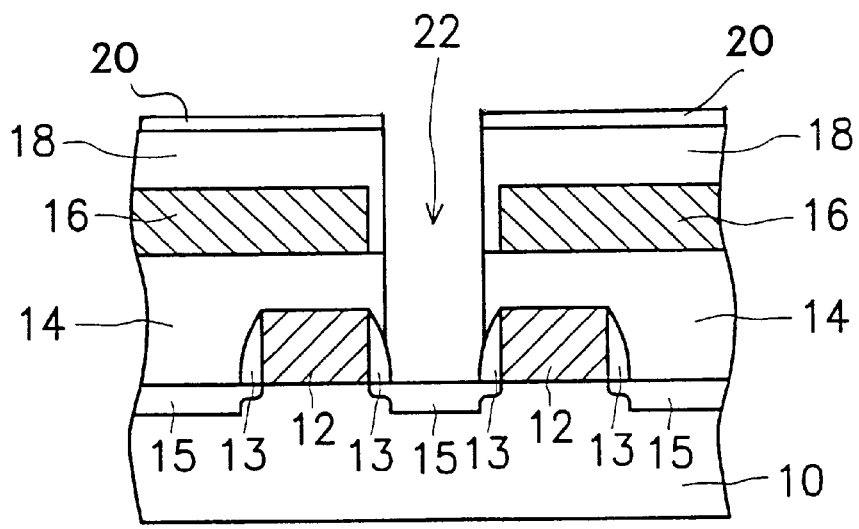
Figure 3A:
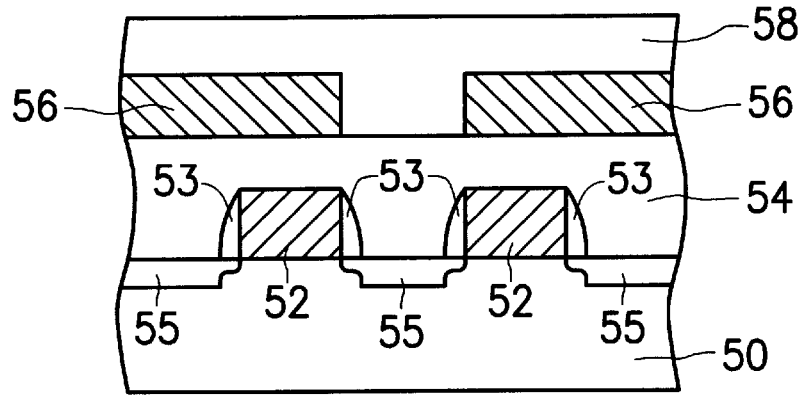
FIGS. 3A–3F respectively show cross-sectional views of a DRAM memory cell unit at various stages of a method, in accordance with a preferred embodiment of the invention, for making contact openings for the cell unit.

Referring to FIG. 3A, a semiconductor substrate 50 has a memory cell unit transistor, together with a first oxide layer 54 for its electrical insulation, bit lines 56, and a second oxide layer 58 for insulating the bit lines 56 formed thereon. The transistor includes a gate electrode 52, sidewall spacer 53 for the gate electrode 52, and a pair of source/drain regions 55. The first oxide layer 54 and the second oxide layer 58 can be formed, for example, of silicon oxide, and the bit line 56 may be, for example, doped polysilicon. In addition to covering the surface of the bit lines 56, the second oxide layer 58 further fills into the spacing between consecutive bit lines 56. The spaces between bit lines 56 are substantially located above the corresponding source/drain region 55 of the cell unit transistor. In other words, the bit lines 56 themselves are virtually misaligned vertically with the transistor source/drain region 55.

Figure 3B:
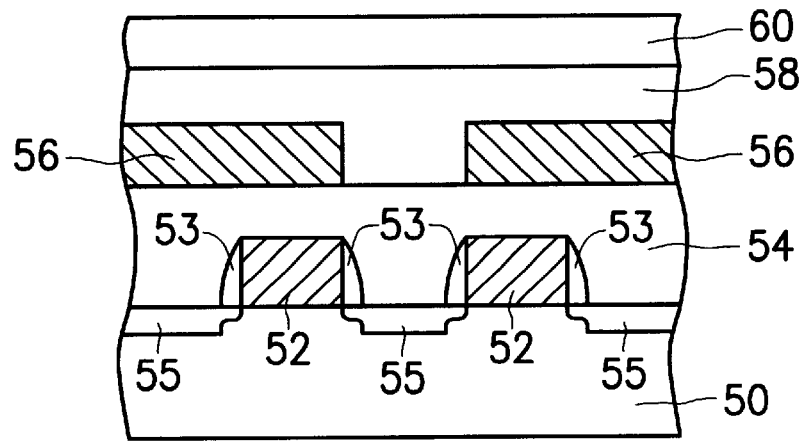

Then, as is illustrated in FIG. 3B, a polysilicon or silicon nitride layer 60 is formed covering the surface of the second oxide layer 58 in, for example, an LPCVD procedure. If polysilicon is used for deposition, it can be further doped with suitable impurities.

Figure 3C:
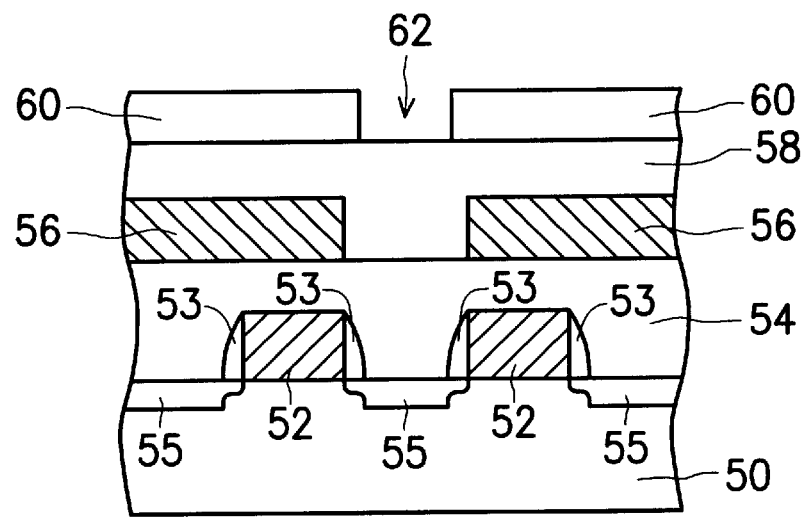

Referring to FIG. 3C, a photolithographic procedure is then employed to form an opening 62 in layer 60. The location for this opening 62 is virtually above the transistor source/drain region 55 as shown in the drawing. Anisotropic etching can be implemented against layer 60, and the etching terminates when the surface of the second oxide layer 58 is exposed. This includes forming a photoresist layer that exposes the location of the opening 62, and subsequently etching anisotropically into the doped polysilicon or silicon nitride layer 60.

Figure 3D:
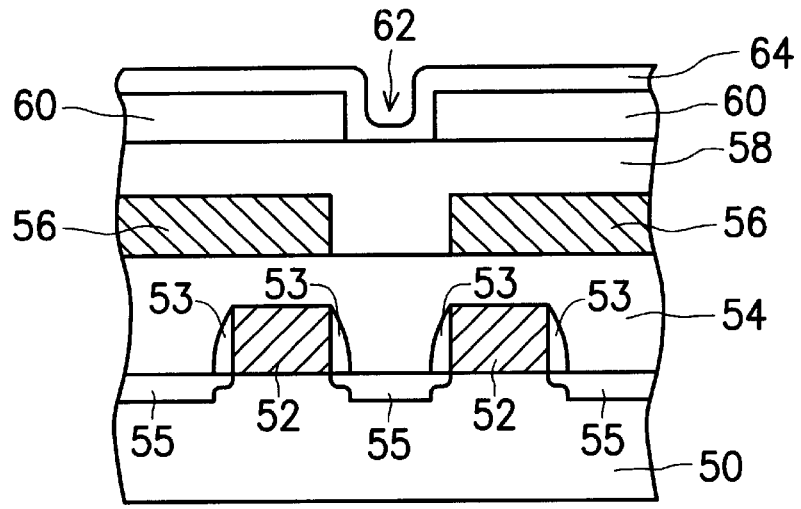

Then, as shown in FIG. 3D, a spacer material such as doped polysilicon 64 is formed over the surface of the entire device substrate at this stage. This can be done by, for example, implementing an LPCVD that deposits polysilicon. The deposition also accumulates the deposited material inside the opening 62. In the case wherein polysilicon is used, it can further be doped with impurities. This doped layer 64 can be used as the lower electrode for the storage capacitor of the memory cell unit in the later fabrication procedures.

Figure 3E:
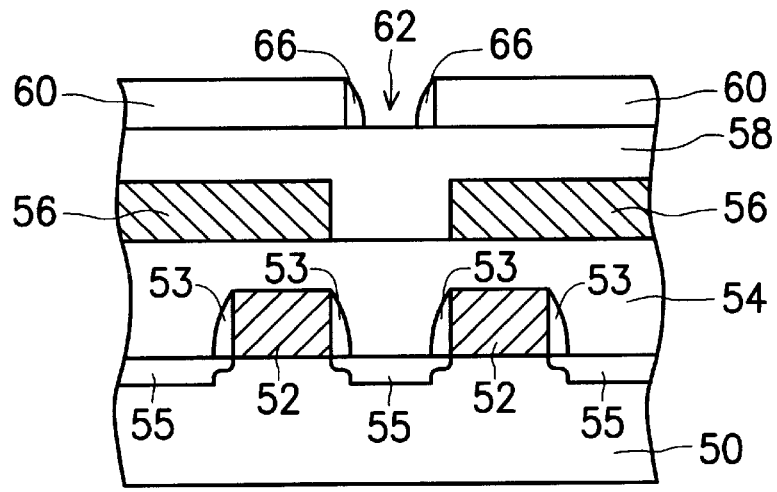

Referring to FIG. 3E, an anisotropic etching procedure may then be employed to etch into the doped layer 64 on the surface of the device substrate. Sidewall spacer 66 is formed as a result of the removal of the doped layer 64 from the surface of both the entire device substrate and the bottom of the opening 62.

Figure 3F:
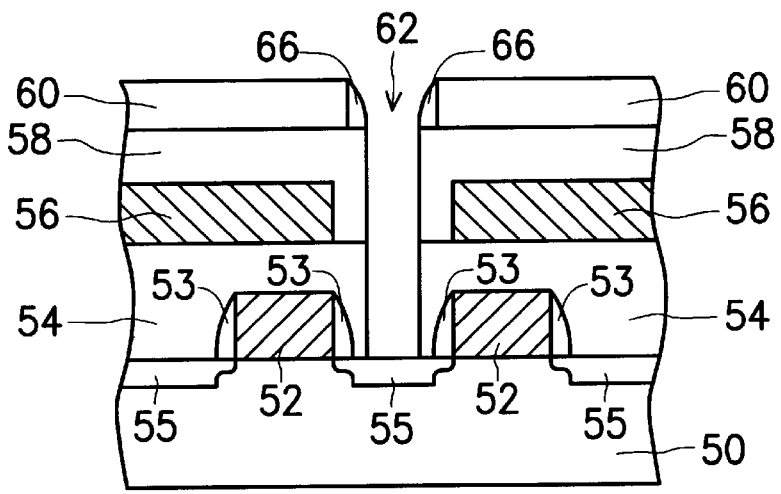

The presence of the sidewall spacer 66 in the opening 62 reduces the size of the contact opening to be formed for the transistor source/drain region 55. In this manner, the initial opening 62 can be formed utilizing the conventional technique that employs deep ultraviolet photolithography. After the formation of the sidewall spacer 66, the size of the contact opening to be formed utilizing the layer 60 with the initial opening 62 as the etching mask can be reduced effectively. Thus, as is illustrated in FIG. 3F, when an anisotropic etching procedure is performed, the second oxide layer 58 and the first oxide layer 54 are subsequently etched. The anisotropic etching procedure stops when the source/drain region 55 of the cell unit transistor is exposed, and the final contact opening 62 is then formed.

This method of forming contact opening for the cell unit transistor substantially avoids the possibility of short-circuiting to the bit lines 56 embedded in the structure by the contact via formed in these openings 62. This is because the diameter of the contact openings is substantially reduced. As a result, the device yield can be improved significantly.

After the formation of the contact opening 62 in FIG. 3F, post procedural steps of the fabrication of the memory cell unit can be continued. This includes the formation of cell unit storage capacitor bottom electrode utilizing the layer 60, if layer 60 is a doped polysilicon layer. When the conductive via is formed inside the contact opening 62, the source/drain 55 of the cell unit transistor may then be electrically connected to the corresponding electrode, the bottom electrode in this case, of the storage capacitor.

The method of the invention for making contact openings can result in contact openings that are smaller in diameter than those achieved by the conventional method. Based on the fact that each of the contact openings is for the electrical connection between the source/drain terminal of the memory cell unit transistor relatively deep down in the substrate and the corresponding electrode of the storage capacitor located above, misalignment of the position of the contact opening may thus become a less significant problem. Device yields can be improved as a result.

While the invention has been described by way of example and in terms of the preferred embodiment, it is to be understood that the invention need not be limited to the disclosed embodiments. To the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a contact opening for a memory cell unit of a semiconductor dynamic random-access memory integrated circuit device, comprising:

forming on a substrate, a cell unit transistor, a first oxide layer insulating the transistor, and a bit line, the bit line on the first oxide layer;

forming a second oxide layer for insulating the bit line, the second oxide layer covering the first oxide layer, such that the first and second oxide layers are in direct contact with each other throughout a contact area above the source/drain region of the transistor;

forming a shielding layer covering the second oxide layer;

patterning the shielding layer to form an initial opening for defining the contact opening located substantially above the source/drain region of the transistor to be electrically connected, and revealing the surface of the second oxide layer in the region of the defined contact opening;

forming a sidewall spacer covering the sidewall of the initial opening and in direct contact with the second oxide layer;

after said forming a sidewall spacer, etching into the second oxide layer where the surface of the second oxide layer is revealed in the initial opening, and through the first oxide layer only in an area within and smaller than the contact area, so as to reveal the surface of the source/drain region, and forming a capacitor bottom plate that includes the shielding layer and the sidewall spacer.

2. The method of fabricating the contact opening of claim 1, wherein the shielding layer is formed in a low-pressure chemical vapor deposition procedure depositing polysilicon or silicon nitride.

3. The method of fabricating the contact opening of claim 1, wherein the step of patterning the shielding layer comprises implementing a photolithographic procedure.

4. The method of fabricating the contact opening of claim 1, wherein the step of forming the sidewall spacer covering the sidewall of the initial opening further comprises:

a polysilicon layer covering the surface of the shielding layer and the bottom of the initial opening; and etching the polysilicon layer to remove the polysilicon layer covering the surface of the shielding layer and forming the sidewall spacer.

5. The method of fabricating the contact opening of claim 4, wherein the polysilicon layer covering the shielding layer is formed in a low-pressure chemical vapor deposition procedure.

6. The method of fabricating the contact opening of claim 4, wherein the etching the polysilicon layer is an anisotropic etching procedure.

7. The method of fabricating the contact opening of claim 1, wherein the etching into the second and the first oxide layers is an anisotropic etching procedure.

8. The method of fabricating the contact opening of claim 1, wherein the bit lines are located misaligned with the source/drain region of the cell unit transistor to be electrically connected by the via formed in the contact opening.

9. The method of fabricating the contact opening of claim 1, wherein the shielding layer is formed of doped polysilicon.

10. The method of fabricating the contact opening of claim 1, wherein the shielding layer is formed of silicon nitride.

11. The method of fabricating the contact opening of claim 1, wherein the sidewall spacer is formed of doped polysilicon.

12. A method of fabricating a contact opening for a memory cell unit of a semiconductor dynamic random-access memory integrated circuit device, the contact opening being used for installing an electrically conductive via for connecting the source/drain region of the cell unit transistor and an electrode of the storage capacitor of the memory cell unit, the method comprising:

forming on a substrate, a cell unit transistor, a first oxide layer insulating the transistor, and a bit line, the bit line on the first oxide layer;

forming a second oxide layer for insulating the bit line, the second oxide layer covering the first oxide layer, such that the first and second oxide layers are in direct contact with each other throughout a contact area of the surface of the first oxide layer above the source/drain region of the transistor;

forming a shielding layer covering the second oxide layer;

patterning the shielding layer in a photolithographic procedure to form an initial opening for defining the contact opening, the initial opening located substantially above the source/drain region of the transistor to be electrically connected, and revealing the surface of the second oxide layer in the region of the defined contact opening;

forming a sidewall spacer covering the sidewall of the initial opening and in direct contact with the second oxide layer;

after said forming a sidewall spacer, anisotropically etching into the second oxide layer, where the surface of the second oxide layer is revealed in the initial opening, and through the first oxide layer in only a portion of the contact area, so as to reveal the surface of the source/drain region; and forming a capacitor bottom plate that includes the shielding layer and the sidewall spacer.

13. A method of fabricating a contact opening for a memory cell unit of a semiconductor dynamic random-access memory integrated circuit device, comprising:

forming a cell unit transistor on a substrate, insulating the transistor with a first oxide layer, forming a bit line on the first oxide layer;

forming a second oxide layer directly on the bit line and the first oxide layer, so as to cover the first oxide layer and insulate the bit line such that the first and second oxide layers are in direct contact with each other throughout an area that includes a contact area of the surface of the first oxide layer above the source/drain region of the transistor, the contact area being larger than a cross-sectional area of the contact opening to be fabricated;

forming a shielding layer directly on the second oxide layer so as to cover said second oxide layer;

patterning the shielding layer to form an initial opening substantially above the source/drain region of the transistor, the initial opening exposing a surface area of the second oxide layer;

forming a sidewall spacer covering a sidewall of the initial opening and in direct contact with a peripheral portion of the exposed surface area, and filling a peripheral portion of the initial opening;

etching into the second oxide layer where the surface of the second oxide layer is exposed within the initial opening, and through the first oxide layer, so as to form the contact opening with a cross-sectional area smaller than the exposed surface area, the formed contact opening revealing the surface of the source/drain region; and forming a capacitor bottom plate that includes the shielding layer and the sidewall spacer.

* * * * *